United States Patent
Peumans et al.

(10) Patent No.: US 7,196,835 B2
(45) Date of Patent: Mar. 27, 2007

(54) APERIODIC DIELECTRIC MULTILAYER STACK

(75) Inventors: Peter Peumans, Palo Alto, CA (US); Stephen Forrest, Princeton, NJ (US)

(73) Assignee: The Trustees of Princeton University, Princeton, NJ (US)

( * ) Notice: Subject to any disclaimer, the term of this patent is extended or adjusted under 35 U.S.C. 154(b) by 444 days.

(21) Appl. No.: 10/857,747

(22) Filed: Jun. 1, 2004

(65) Prior Publication Data

US 2005/0266218 A1    Dec. 1, 2005

(51) Int. Cl.
*G02F 1/03*    (2006.01)

(52) U.S. Cl. ....................................... 359/245

(58) Field of Classification Search ................ 359/245, 359/248, 249, 250, 254, 580, 582, 584, 586, 359/589; 250/368, 483.1, 487.1; 257/79–103; 372/4, 43–50, 92, 93, 96, 99
See application file for complete search history.

(56) References Cited

U.S. PATENT DOCUMENTS

| | | | |
|---|---|---|---|
| 4,309,075 A | 1/1982 | Apfel et al. | |
| 5,239,190 A | 8/1993 | Kawasaki | |
| 5,264,715 A | 11/1993 | Guenter et al. | |
| 5,703,436 A | 12/1997 | Forrest et al. | |
| 5,707,745 A | 1/1998 | Forrest et al. | |
| 5,753,940 A | 5/1998 | Komoto | |
| 5,844,363 A | 12/1998 | Gu et al. | |
| 5,881,089 A | 3/1999 | Berggren et al. | |
| 6,078,421 A | 6/2000 | Davey et al. | |
| 6,130,780 A | 10/2000 | Joannopoulos et al. | |
| 6,208,466 B1 | 3/2001 | Liu et al. | |
| 6,229,834 B1 | 5/2001 | Nisitani et al. | |
| 6,303,238 B1 | 10/2001 | Thompson et al. | |
| 6,347,109 B1 | 2/2002 | Beach et al. | |
| 6,352,777 B1 | 3/2002 | Bulovic et al. | |
| 6,420,199 B1 * | 7/2002 | Coman et al. | ................. 438/22 |
| 6,429,463 B1 | 8/2002 | Mauk | |
| 6,580,027 B2 | 6/2003 | Forrest et al. | |
| 6,657,378 B2 | 12/2003 | Forrest et al. | |

(Continued)

FOREIGN PATENT DOCUMENTS

WO    WO 2003-029896    4/2003

OTHER PUBLICATIONS

Chance et al., "Molecular Fluorescence and Energy Transfer Near Interfaces" Adv. Chem. Phys. 37, 1-65 (1978).

(Continued)

*Primary Examiner*—Hung Xuan Dang
*Assistant Examiner*—Tuyen Tra
(74) *Attorney, Agent, or Firm*—Kenyon & Kenyon LLP

(57) ABSTRACT

A structure is provided that includes an aperiodic dielectric stack. The structure may include a substrate, a device disposed over the substrate, and a first dielectric stack disposed between the substrate and the device. The first dielectric stack includes a plurality of layers comprising a first dielectric material, wherein at least two of the layers comprising a first dielectric material have substantially different thicknesses, as well as a plurality of layers comprising a second dielectric material. The average outcoupling efficiency into air of the device over a bandwidth of at least 300 nm may be at least 40% greater than that of an otherwise identical device disposed in a structure without the first dielectric stack.

25 Claims, 12 Drawing Sheets

U.S. PATENT DOCUMENTS

| | | | |
|---|---|---|---|
| 6,898,215 B2 * | 5/2005 | Naone et al. | 372/4 |
| 2003/0035361 A1 | 2/2003 | Knight et al. | |
| 2003/0085652 A1 | 5/2003 | Weaver | |

OTHER PUBLICATIONS

Andreev et al., "High-Efficiency AlGaAs-GaAs Solar Cells with Internal Bragg Reflectro," 1994 IEEE First World Conference on Photovoltaic Energy Conversion, Dec. 5-9, 1994, Waikoloa, Hawaii, vol. II, pp. 1894-1897.

Tobin et al., "Enhanced Light Absorption in GaAs Solar Cells with Internal Bragg Reflectors," Twenty Second IEEE Photovoltaic Specialists Conference- 1991, Las Vegas, Nevada, Oct. 7-11, 1991, vol. 1, pp. 147-152.

Corzine et al., "A Tanh Substitution Technique for the Analysis of Abrupt and Grade Interface Multiplayer Dielectric Stacks," IEEE Journal of Quantum Electronics, vol. 27, No. 9, Sep. 1991, pp. 2086-2090.

Keys et al., "Characterization of a Multilayered Dielectric Transmissive Phase Modulator," Proceedings of the SPIE, vol. 4438, Physics, Theory, and Applications of Periodic Structures in Optics, Aug. 1-2, 2001, San Diego, California, pp. 96-107.

Gheorma et al. "Aperiodic Nanophotonic Design," Journal of Applied Physics, vol. 95, No. 3, Feb. 2004, pp. 1420-1426.

Chen et al. "Adaptive design of nanoscale dielectric structures for photonics," Journal of Applied Physics, vol. 94, No. 9, Nov. 2003, pp. 6065-6068.

Chen et al. "Fabry-Perot-type antireflective coating for deep-ultraviolet binary photomask applications," Applied Optics, vol. 41, No. 19, Nov. 2002, pp. 3961-3965.

Peumans, et al., "Small molecular weight organic thin-film photodectors and solar cells", Journal of Applied Physics, vol. 93, No. 7, pp. 3693-3723, Apr. 1, 2003.

R.H. Jordan, et al., "Efficiency enhancement of microcavity organic light emitting diodes", Appl. Phys. Lett 69(14), pp. 1997-1999, Sep. 30, 1996.

A.S. Keys et al., "Full cycle, low loss, low distortion phase modulation from multilayered dielectric stacks with terahertz optical bandwidth", Optics Express, vol. 7, No. 9, pp. 311-322, Oct. 23, 2000.

P. Peumans, et al., "Influence of device architecture and interface morphology on the power conversion efficiency of small molecular photovoltaic cells", NCPV and Solar Program Review Meeting 2003.

C. Reese, et al., "Photonic crystal microcavities for cavity quantum electrodynamics", NNUN Abstracts 2002/Optics and Opto-Electronics, p. 86.

M. Lu, et al., "Experiment and modeling of conversion of substrate-waveguided modes to surface-emitted light by substrate patterning", Mat. Res. Soc. Symp. Proc., vol. 621, pp. Q3.7.1-Q3.7.6, 2000.

"Box 2 Purcell effect", Nature insight: review article, <http://www.nature.com/nature/journal/v424/n6950/box/nature01939_bx2.html>, Dec. 18, 2003.

"The Schrödinger cat 'paradox'", <http://www.lkb.ens.fr/recherceh/qedcav/english/rydberg/nonresonant/catparadox.html>, Dec. 18, 2003.

"Resonant atom-field interaction,", <http://www.lkb.ens.fr/recherche/qedcav/english/rydberg/resonant/resonantgene.html>, Dec. 18, 2003.

"Experimental Quantum Rabi Oscillation,", <http:www.lkb.ens.fr/recherche/qedcav/english/rydberg/resonant/quantrabi.html>, Dec. 18, 2003.

"A simple model of the cavity field decoherence", <http://www.lkb.ens.fr/recherche/qedcav/english/rydberg/noresonant/model.html>, Dec. 18, 2003.

"Decoherence caught in the act", <http://www.lkb.ens.fr/recherche/qedcav/english/rydberg/nonresonant/decoherence.html>, Dec. 18, 2003.

"An experiment on complementarity", <http://www.lkb.ens.fr/recherche/qedcav/english/rydberg/nonresonant/complementarity.html>, Dec. 18, 2003.

"Prototype of an ideal quantum measurement device", <http://lkb.ens.fr/recherche/qedcav/english/rydberg/nonresonant/prototype.html>, Dec. 18, 2003.

"Quantum measurement and decoherence", >http://www.lkb.ens.fr/rechereche/qedcav/english/rydberg/nonresonant/measurement.html>, Dec. 18, 2003.

Peter Domokos, "Research Project", <http://th-physik.uibk.ac.at/~domokos/project.html>, Dec. 18, 2003.

JRJ Simulation & Design, "Modeling in Physics, Electronics, Acoustics and Biology, 2D/3D Acoustic Propagation Modeling, example 1", <http://members.cruzio.com/~jaroyan/examples 1.html>, Dec. 18, 2003.

* cited by examiner

US 7,196,835 B2

APERIODIC DIELECTRIC MULTILAYER STACK

FIELD OF THE INVENTION

The present invention relates to the use of optoelectronic devices, and more specifically to optimized aperiodic dielectric multilayer stacks for use with optoelectronic devices, such as OLEDs and photovoltaic cells.

BACKGROUND

Optoelectronic devices rely on the optical and electronic properties of materials to either produce or detect electromagnetic radiation electronically or to generate electricity from ambient electromagnetic radiation. Photosensitive optoelectronic devices convert electromagnetic radiation into electricity. Photovoltaic (PV) devices or solar cells, which are a type of photosensitive optoelectronic device, are specifically used to generate electrical power. PV devices, which may generate electrical power from light sources other than sunlight, are used to drive power consuming loads to provide, for example, lighting, heating, or to operate electronic equipment such as computers or remote monitoring or communications equipment. These power generation applications also often involve the charging of batteries or other energy storage devices so that equipment operation may continue when direct illumination from the sun or other ambient light sources is not available. As used herein the term "resistive load" refers to any power consuming or storing device, equipment or system. Another type of photosensitive optoelectronic device is a photoconductor cell. In this function, signal detection circuitry monitors the resistance of the device to detect changes due to the absorption of light. Another type of photosensitive optoelectronic device is a photodetector. In operation a photodetector has a voltage applied and a current detecting circuit measures the current generated when the photodetector is exposed to electromagnetic radiation. A detecting circuit as described herein is capable of providing a bias voltage to a photodetector and measuring the electronic response of the photodetector to ambient electromagnetic radiation. These three classes of photosensitive optoelectronic devices may be characterized according to whether a rectifying junction as defined below is present and also according to whether the device is operated with an external applied voltage, also known as a bias or bias voltage. A photoconductor cell does not have a rectifying junction and is normally operated with a bias. A PV device has at least one rectifying junction and is operated with no bias. A photodetector has at least one rectifying junction and is usually but not always operated with a bias.

Optoelectronic devices that make use of organic materials are becoming increasingly desirable for a number of reasons. Many of the materials used to make such devices are relatively inexpensive and conducive to low-cost, continuous manufacturing processes using low temperature vacuum deposition or solution processing techniques, so organic optoelectronic devices have the potential for cost advantages over inorganic devices. In addition, the inherent properties of organic materials, such as their flexibility, may make them well suited for particular applications such as fabrication on a flexible substrate or deposition on non-planar/conformal substrates. Examples of organic optoelectronic devices include organic light emitting devices (OLEDs), organic phototransistors, organic photovoltaic cells (OPV cells), and organic photodetectors. For OLEDs, the organic materials may have performance advantages over conventional materials. For example, the wavelength at which an organic emissive layer emits light may generally be readily tuned with appropriate dopants.

As used herein, the term "organic" includes polymeric materials as well as small molecule organic materials that may be used to fabricate organic optoelectronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

OLED devices are generally (but not always) intended to emit light through at least one of the electrodes, and one or more transparent electrodes may be useful in an organic optoelectronic devices. For example, a transparent electrode material, such as indium tin oxide (ITO), may be used as the bottom electrode. A transparent top electrode, such as disclosed in U.S. Pat. Nos. 5,703,436 and 5,707,745, which are incorporated by reference in their entireties, may also be used. For a device intended to emit light only through the bottom electrode, the top electrode does not need to be transparent, and may be comprised of a thick and reflective metal layer having a high electrical conductivity. Similarly, for a device intended to emit light only through the top electrode, the bottom electrode may be opaque and/or reflective. Where an electrode does not need to be transparent, using a thicker layer may provide better conductivity, and using a reflective electrode may increase the amount of light emitted through the other electrode, by reflecting light back towards the transparent electrode. Fully transparent devices may also be fabricated, where both electrodes are transparent. Side emitting OLEDs may also be fabricated, and one or both electrodes may be opaque or reflective in such devices.

As used herein, "top" means furthest away from the substrate, while "bottom" means closest to the substrate. For example, for a device having two electrodes, the bottom electrode is the electrode closest to the substrate, and is generally the first electrode fabricated. The bottom electrode has two surfaces, a bottom surface closest to the substrate, and a top surface further away from the substrate. Where a first layer is described as "disposed over" a second layer, the first layer is disposed further away from substrate. There may be other layers between the first and second layer, unless it is specified that the first layer is "in physical contact with" the second layer. For example, a cathode may be described as "disposed over" an anode, even though there are various organic layers in between.

Photovoltaic (PV) devices, for example, solar cells, are used to generate electrical power from ambient light. PV devices are used to drive power consuming loads to provide, for example, lighting, heating, or to operate electronic equipment such as computers or remote monitoring or communications equipment. These power generation applications often involve the charging of batteries or other energy storage devices so that equipment operation may continue when direct illumination from the sun or other ambient light sources is not available. PV cells are characterized by the efficiency with which they can convert incident solar power to useful electric power. Devices utilizing crystalline or amorphous silicon dominate commercial applications, and some have achieved efficiencies of 23% or greater. However, efficient crystalline-based devices, especially of large surface area, are difficult and expensive to produce due to the cost and difficulty inherent in producing large crystals without significant efficiency-degrading defects or losses associated with their fragility. On the other hand, high efficiency amorphous silicon devices suffer from problems with stability. Present commercially available amorphous silicon modules have stabilized efficiencies between 4 and 8%. More recent efforts have focused on the use of organic photovoltaic cells to achieve acceptable photovoltaic conversion efficiencies, lower production costs and additional product features like flexibility and semi-transparency.

Traditionally, photosensitive optoelectronic devices have been constructed of a number of inorganic semiconductors, e.g., crystalline, polycrystalline and amorphous silicon, gallium arsenide, cadmium telluride and others. Herein the term "semiconductor" denotes materials which can conduct electricity when charge carriers are induced by thermal or electromagnetic excitation. The term "photoconductive" generally relates to the process in which electromagnetic radiation energy is absorbed and thereby converted to excitation energy of electric charge carriers so that the carriers can conduct, i.e., transport, electric charge in a material. The terms "photoconductor" and "photoconductive material" are used herein to refer to semiconductor materials which are chosen for their property of absorbing electromagnetic radiation to generate electric charge carriers.

PV devices include a p-n junction that enable the device to convert incident radiation into electrical current. Examples of PV devices include solar cells and photodiodes. Solar cells are designed to generate power. Solar cells are designed to generate power. Solar cells generally do not have an external voltage source, but are used to generate a current at a voltage created by the inherent properties of the organic materials used. Photodiodes include a p-n junction, and are generally provided with an external bias and may be used as a photodetector. PV devices may also include at least one transparent electrode to allow incident radiation to be absorbed by the device. Several PV device materials and configurations are described in U.S. Pat. Nos. 6,657,378, 6,580,027, and 6,352,777, which are incorporated herein by reference in their entirety.

Dielectric multilayer films may be used to manipulate the properties of electromagnetic radiation as it passes through the films. The term "dielectric" generally relates to any material that is a relatively poor conductor of electricity, while being capable of efficiently maintaining an electric field. Traditionally, a substance having a relatively low conductivity (compared to that of a metal), such as a ceramic, glass, plastic, or even air may be used as a dielectric. In some substances, such as semiconductors, conductivity increases with temperature. A dielectric material may be discussed with respect to its permittivity (or dielectric function), which is a measure of the frequency-dependent response of a material to excitation by an electric field. In mathematical notation, permittivity is written in complex notation in order to take wave absorption into account, therefore, it includes a real component relating to the polarization of the wave and an imaginary component relating to the absorption of the wave. The index of refraction of a material may also be expressed using complex notation, where the real component relates to the phase velocity of the wave and the imaginary component relates to the absorption coefficient (also called the attenuation index or extinction coefficient). Maxwell's equations give a basic relationship between the permittivity of a material and its index of refraction, therefore, the index of refraction may be described in terms of the permittivity.

A great deal of information about the interaction of an optical wave with a semiconductor material, and a useful quantification of the behavior, may be expressed in terms of either of these sets of parameters. Using the Kramers-Krönig relations, if either the real or the imaginary part of a frequency dependent quantity is known for all frequencies, the other may be calculated. Accordingly, if a full absorption spectrum is known, the index of refraction may be calculated for any frequency. Therefore, these relations are often used to derive a representation of the index of refraction from absorption or reflectance data obtained by experiment. The Kramers-Krönig relations also give rise to expressions of relationship between the reflectance and the phase difference between the electric fields of the incident and reflected waves.

SUMMARY OF THE INVENTION

A structure is provided that includes an aperiodic dielectric stack. The structure may include a substrate, a device disposed over the substrate, and a first dielectric stack disposed between the substrate and the device. The first dielectric stack includes a plurality of layers comprising a first dielectric material, wherein at least two of the layers comprising a first dielectric material have substantially different thicknesses, as well as a plurality of layers comprising a second dielectric material. The average outcoupling efficiency into air of the device over a bandwidth of at least 300 nm may be at least 40% greater than that of an otherwise identical device disposed in a structure without the first dielectric stack. The substrate may have a treated surface such that light that may otherwise be waveguided in the substrate is outcoupled into air, and the average outcoupling efficiency into air of the device over a bandwidth of at least 300 nm may be at least 10% greater than that of an otherwise identical device disposed in a structure without the first dielectric stack. The structure may include an optical cavity defined by a first end layer and a second end layer, where the first end layer further comprising a first dielectric stack having a plurality of layers comprising a first dielectric material, wherein at least two of the layers comprising a first dielectric material have substantially different thicknesses, and a plurality of layers comprising a second dielectric material. An optoelectronic device having a first active layer may be disposed within the optical cavity.

DETAILED DESCRIPTION

Figure 1:
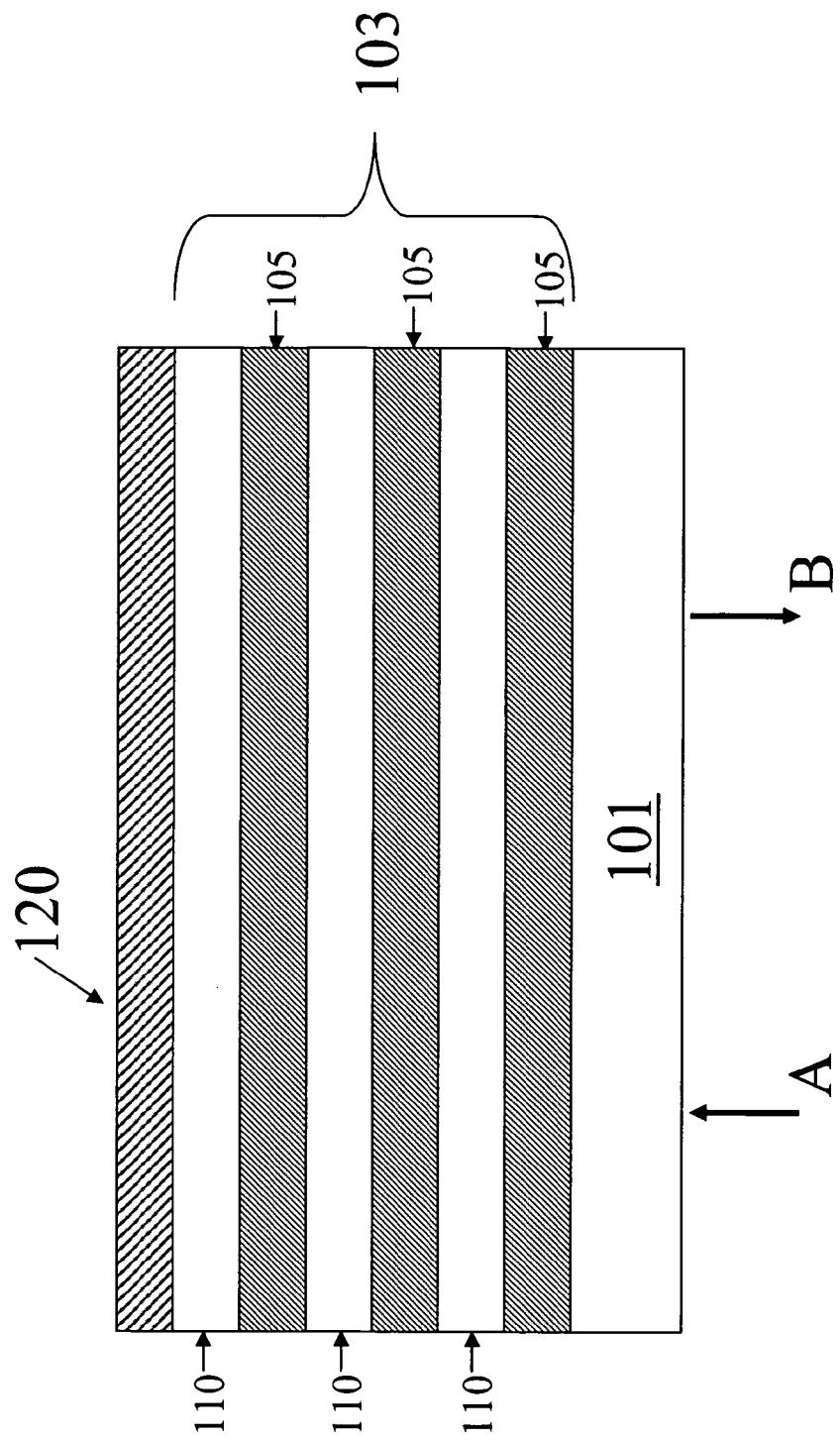
FIG. 1 shows an exemplary embodiment of a structure including an aperiodic dielectric multilayer stack having six layers.

The photoresponse of organic PV cells with a well-defined layer structure can be accurately predicted by modeling the optical properties of the multilayer stack while simultaneously solving for exciton diffusion. Using aperiodic multilayer stacks, significant light coupling improvements may be realized, for example, a broad increase in coupling of light across the visible spectrum may be realized. Thin layer optoelectronic devices, designed for optimal diffusion efficiency, may suffer losses in, for example, absorption efficiency due to the thinness of the components. Aperiodic dielectric multilayer mirrors may be designed that have a reasonable reflectivity and a tailored phase behavior. Therefore, when these mirrors are used in combination with, for example, thin layer devices, gains in, for example, absorption efficiency and external quantum efficiency may be achieved. For example, a stack may be designed that would allow normally incident photons, or photons within a certain angle to normal incidence, to pass while blocking other photons. Therefore, the incident photons which reach, for example, the emissive layers of an OLED positioned behind the stack are incident in a direction which is conducive to increase the electromagnetic intensity out of the device. The aperiodic stacks may also be used as encapsulation structures for sealing an optoelectronic device, such as disclosed in U.S. patent Application 2003/0085652.

Computer optimization of such novel aperiodic structures may utilize an optimization algorithm because the lack of repetition in the structure needed to achieve broad spectral acceptance may require a searching, or so-called "genetic," algorithm to rapidly converge on an acceptable, although not necessarily fully optimized, structure. According to an exemplary embodiment, the optimization algorithm that is used to determine dielectric stacks layer thickness starts from an initial layer configuration that may be either user defined or randomly chosen. Starting from this initial guess, a locally optimal solution may be obtained by the Nelder-Mead simplex method. This method requires the target function to be evaluated and is based on a number of simple rules. The implementation of this algorithm that is provided in, for example, Matlab may be used for this purpose.

This algorithm may not arrive at all possible solutions, for example, those that are not part of the local optimum. Therefore, after a locally optimal solution is found, a random number of layer thicknesses may be randomly changed to generate a new initial solution. If this initial solution evolves to a better global solution using, for example, the Nelder-Mead optimization, this new, more optimal solution may be retained and used as a basis for further optimization. This method is called "genetic" optimization. The layer thicknesses have the same function as the genetic code. The result of a chance in the genetic code may not be easily predicted, however, by letting the system evolve long enough and by forcing a selection, eventually, optimal solutions will arise.

Without intending to be limited by any theory as to why the invention works, it is believed that, for example, the directionality of incident photons may affect the directionality of photons emitted by the emissive layer, and that decreasing the proportion of incident photons having a direction that is at a large angle to perpendicular to the plane of the OLED may reduce the number of emitted photons having such an angle. Because such photons are more likely to be waveguided and/or reflected than photons traveling close to perpendicular to the plane of the substrate, waveguiding and reflection are reduced.

FIG. 1 shows an exemplary embodiment of a structure including an aperiodic dielectric multilayer stack 103 having six layers 105, 110 over a substrate 101. Any appropriate substrate 101 and any pair of dielectric materials 105, 110 having different refractive indices may be used. It may be desired for substrate 101 to be a transparent material, such as glass, quartz, sapphire, or plastic. For example, a glass substrate 101 and alternating layers 105 of $TiO_2$, having a refractive index of 2.25, and layers 110 of $SiO_2$, having a refractive index of 1.45, may be used. According to FIG. 1, layers 105 and 110 are alternatingly applied to substrate 101, such that substrate 101 is in contact with bottom layer 105. Layers 105 may be formed of a substance having a higher index of refraction than that of layers 110. According to an example embodiment of the present invention, the relationship between the indices of refraction of the layers follows an alternating high-low pattern, as shown in FIG. 1. The layers 105, 110 may be applied by a known method, for example, by vapor deposition. An optoelectronic device 120 may be applied over top layer 110. Optoelectronic device 120 may be configured to emit and/or absorb electromagnetic radiation. If optoelectronic device 120 is configured to absorb radiation, the radiation first passes through the substrate 101 and the dielectric stack 103, as indicated by arrow A. If optoelectronic device 120 is configured to emit radiation, the radiation emitted by optoelectronic device 120 first passes through the dielectric stack 103 and the substrate 101, as indicated by arrow B. Optoelectronic device 120 may include several layers of different materials, for example organic layers, metal layers, semiconductor layers, nanoparticle or nanorod layers, and oxide layers; a simplified representation is depicted here.

Other configurations may be used, for example, the components may be combined in many different arrangements. According to another exemplary embodiment, the substrate 101 may be in contact with layer 110. According to additional exemplary embodiments, the aperiodic dielectric multilayer stack may be applied on the same side of the substrate as the optoelectronic device, or on another side of the substrate. Furthermore, additional substrates, optoelectronic devices, and/or aperiodic dielectric multilayer stacks may be applied.

According to an exemplary embodiment of the present invention, an aperiodic dielectric multilayer stack 103 may have layers 105, 110, which are formed of different thickness. For example, at least two of the layers 105 and/or at least two of the layers 110 may have substantially different thickness. By "substantially different" thickness, it is meant that one layer has a thickness at least 10% greater than another layer. For example, in the Table 1, below, which describes the alternating layers of TiO$_2$ and SiO$_2$ in an exemplary structure, layer 9 is 418 angstroms of TiO$_2$, and layer 11 is 548 angstroms of TiO$_2$—31% greater than layer 9. A 10% change in thickness may correspond to a 10% change in wavelength. For example, 10% may correspond to a 50 nm change in a spectrum centered at 500 nm. The thickness of each layer may be calculated by, for example, performing the genetic algorithm optimization. The optimization may take into account the interaction of the light as it passes through the entire structure including optoelectronic device 120, stack layers 105, 110, and the substrate 101. For example, each component of the optoelectronic device, in particular the reflective backplane, may be taken into account in the optimization. Additionally, the reradiation of light from various components of the optoelectronic device, for example, the reradiation of incident or reflected light from nanoparticles or nanorods within the components may be taken into account in the optimization. Therefore, the internal architecture and design of the device 120 will influence the desired location(s) of a particular wavelength or a range of wavelength antinodes within the structure and may thus be figured into the optimization. Accordingly, the specific thickness of the substrate 101, optoelectronic device 120, and each individual layer 105, 110 may be calculated in order to increase the optical outcoupling or incoupling efficiency of the structure.

The Dydadic Green's function approach may be used for calculating the outcoupling efficiency of an OLED structure. This method decomposes the electric field generated by the emitting dipole into plane waves. See, for example, Chance, Prock and Silbey, *Adv. Chem. Phys.* 37, 1–65 (1978)), for further details regarding the Dydadic Green's function. For each plane wave direction, the resonant enhancement of the emitted field may be evaluated using the transfer matrix method, as conventionally calculated. The resulting increase in radiative emission into the direction corresponding to that plane wave is then:

$$\frac{b}{b_0} = 1 + \frac{3qn}{2\mu k}\text{Im}(E_R),$$

where b is the actual emission rate, $b_0$ is the emission rate in free space, q is the elementary charge, n is the refractive index of the material in which the dipole resides, $\mu$ is the emitting dipole strength, k is the propagation constant (k=$\omega$n/c) and $E_R$ is the reflected electric field as a result of the dipole $\mu$. A multilayer structure that results in a resonance for a certain emission angle will result in a large fraction of the light being emitted into that angle.

The number of layers to be used in the stack 103 may be derived from the optimization as well. The optimal number layers may be determined by the properties of the other structure components with which it used, for example, the substrate 101, and the optoelectronic device 120. The optimization may be carried out over a discreet band of wavelengths, for example, in the range of 300 nm to 900 nm. According to a preferred exemplary embodiment, the optimization may be weighted to the solar spectrum. The solar spectrum optimization may be particularly useful if, for example, a solar cell is used as the optoelectronic device.

Figure 2:
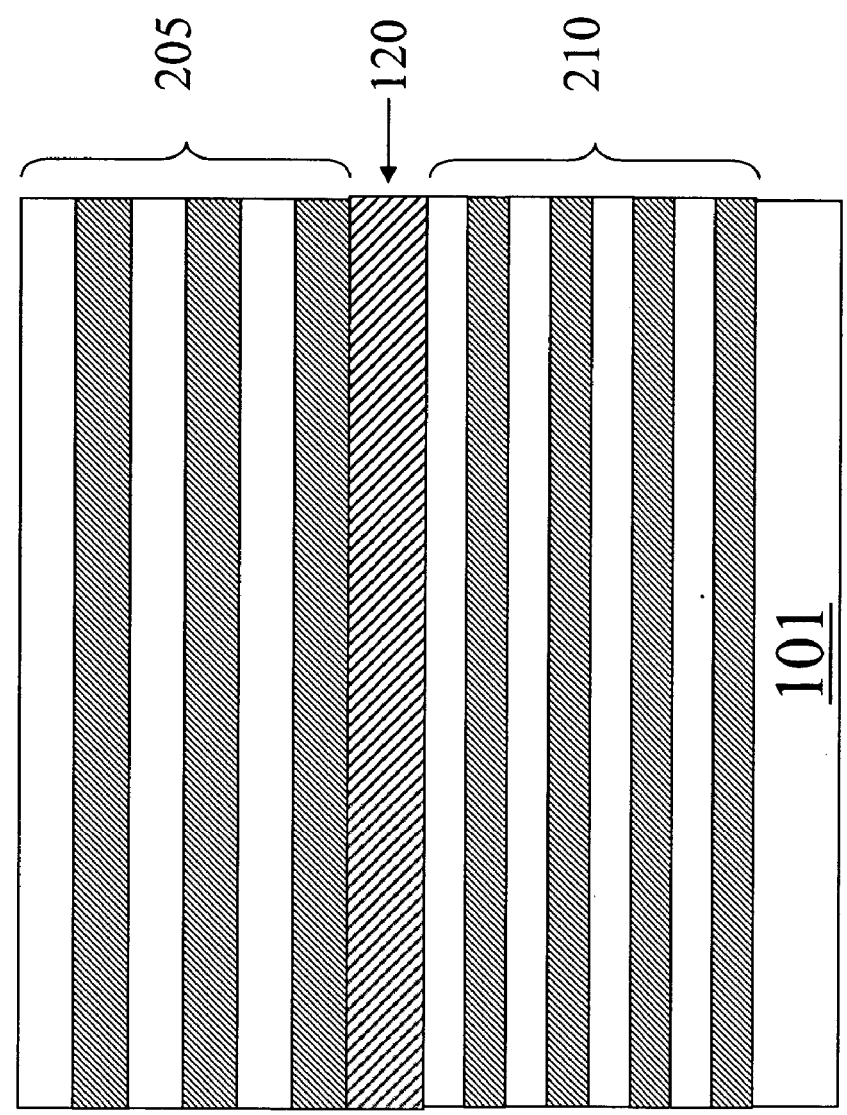
FIG. 2 shows a structure including two aperiodic dielectric multilayer stacks applied to an optoelectronic device.

FIG. 2 shows a structure including two aperiodic dielectric multilayer stacks 205, 210 applied to an optoelectronic device. Stack 205 may be constructed to be identical to stack 210, or the two stacks 205, 210 may have different constructions. For example, stack 205 may have 6 layers and stack 210 may have 8 layers. The individual layers of each stack 205, 210 may also vary as to materials and thickness of layers, as long as the relationship between the indices of refraction of the layers follows the relationship described above with regard to FIG. 1 (alternating high-low pattern). Using the optimization mentioned above, the appropriate number of layers and thickness of layers for each component of the structure may be determined. According to this embodiment, the stack may be designed according to several criteria such as, achieving total transmission for any wavelength resonant in the gap between the two stacks, maximizing the field strength at a desired location between the two stacks, and/or creating an antinode at a desired point between the two stacks. Therefore, the device situated between the two stacks will influence the properties of the gap between the stacks and may be figured into the optimization accordingly.

Figure 3:
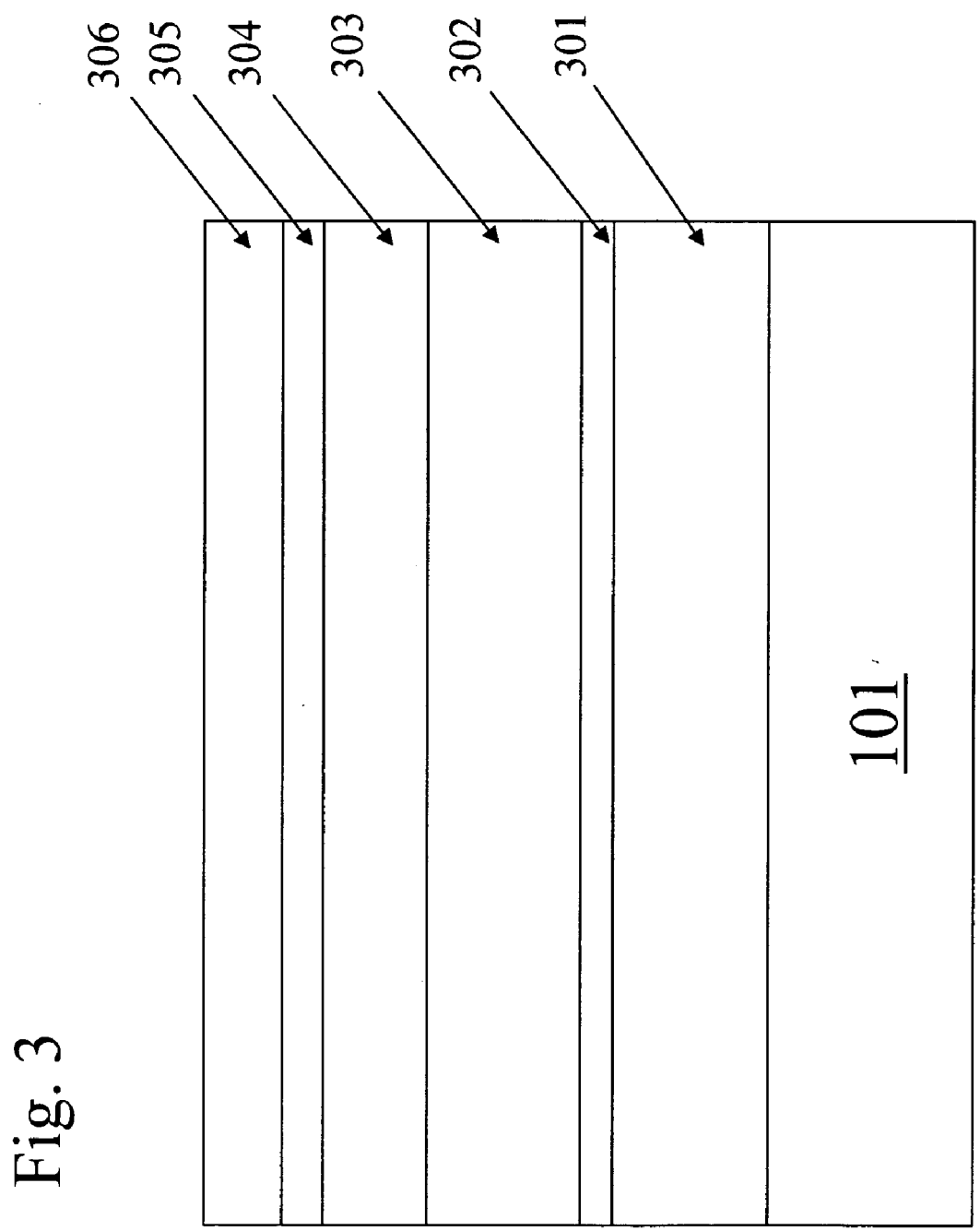
FIG. 3 shows another exemplary embodiment of a structure including an aperiodic dielectric multilayer stack having six layers.

FIG. 3 shows another exemplary embodiment of a structure including an aperiodic dielectric multilayer stack having six layers, specifically layers 301, 302, 303, 304, 305 and 306. The six layers in this example embodiment may each composed of a different material, each material having a different index of refraction, n1, n2 . . . n6. However, the relationship between the subsequent indices of refraction still follows the alternating high-low pattern. Therefore, n1>n2, n2<n3, n3>n4, n4<n5, and n5>n6. Accordingly, embodiments of the present invention may be obtained by various combinations of materials having the appropriate relationships for their indices of refraction. The thickness of the layer of a given material with a given index of refraction may be determined according to the optimization, as stated above.

Figure 4:
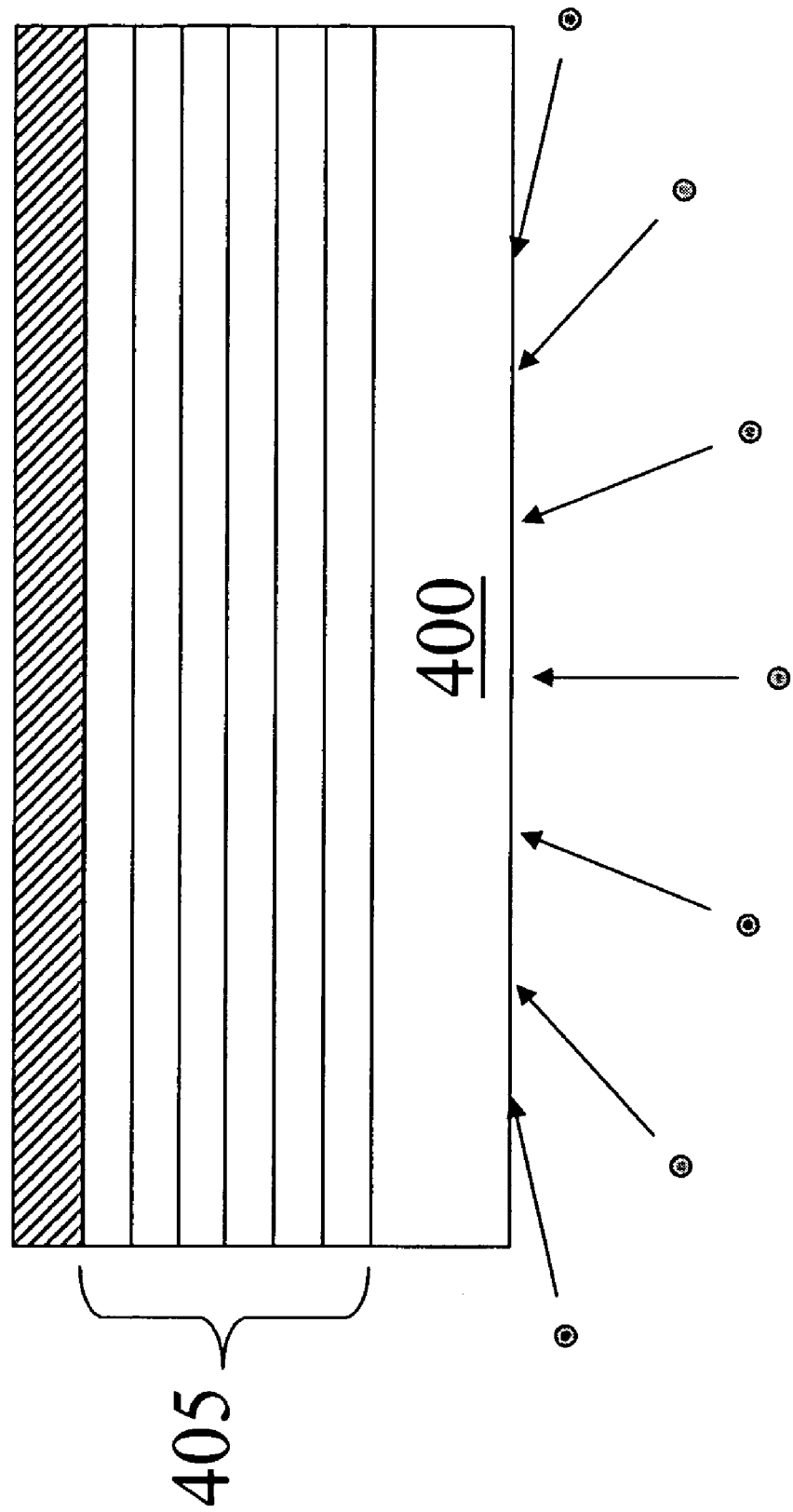
FIG. 4 shows photons incident at different angles upon a structure including a photoelectric device and an aperiodic dielectric multilayer stack.

FIG. 4 shows photons incident at different angles upon a structure including a photoelectric device 420 and an aperiodic dielectric multilayer stack 405. Ambient photons may impinge upon the structure from the direction of the substrate 400. One aspect of certain embodiments of the invention is that a dielectric stack may be constructed that filters out high-angle photons (photons at a large angle from perpendicular to the plane of the stack) over a wide spectra, while passing low-angle photons over the wide spectra. According to FIG. 4, the stack 405 may be constructed such that a greater percentage of photons falling within the shaded area may be transmitted then that of photons falling outside the shaded area. The wide spectra is preferably at least 300 nm wide, and may be 600 nm wide or greater.

The optical outcoupling or incoupling efficiency of light within the wide spectra through a structure including such a stack 405 may be at least 10% greater than the outcoupling or incoupling efficiency of the same structure that does not include the stack. The stack 405 may be tailored to increase the outcoupling or incoupling efficiency for a particular wavelength, or for a range of wavelengths, according to the desired optimization. Therefore, the stack 405, as well as the entire structure, may be optimized, for example, to increase the outcoupling or incoupling efficiency over a spectrum ranging from 450 nm to 750 nm. By way of example, "high angle photons" may include photons traveling in directions that are not within, for example, 30 degrees of normal to the plane of the dielectric stack, and "low angle photons" may include photons traveling in a direction within, for example, 10 degrees of normal to the dielectric stack. A dielectric stack may be constructed in accordance with embodiments of the invention that is transparent to low angle photons over a wide spectra, while transmitting at most 60% of high angle photons over the wide spectra.

Figure 5:
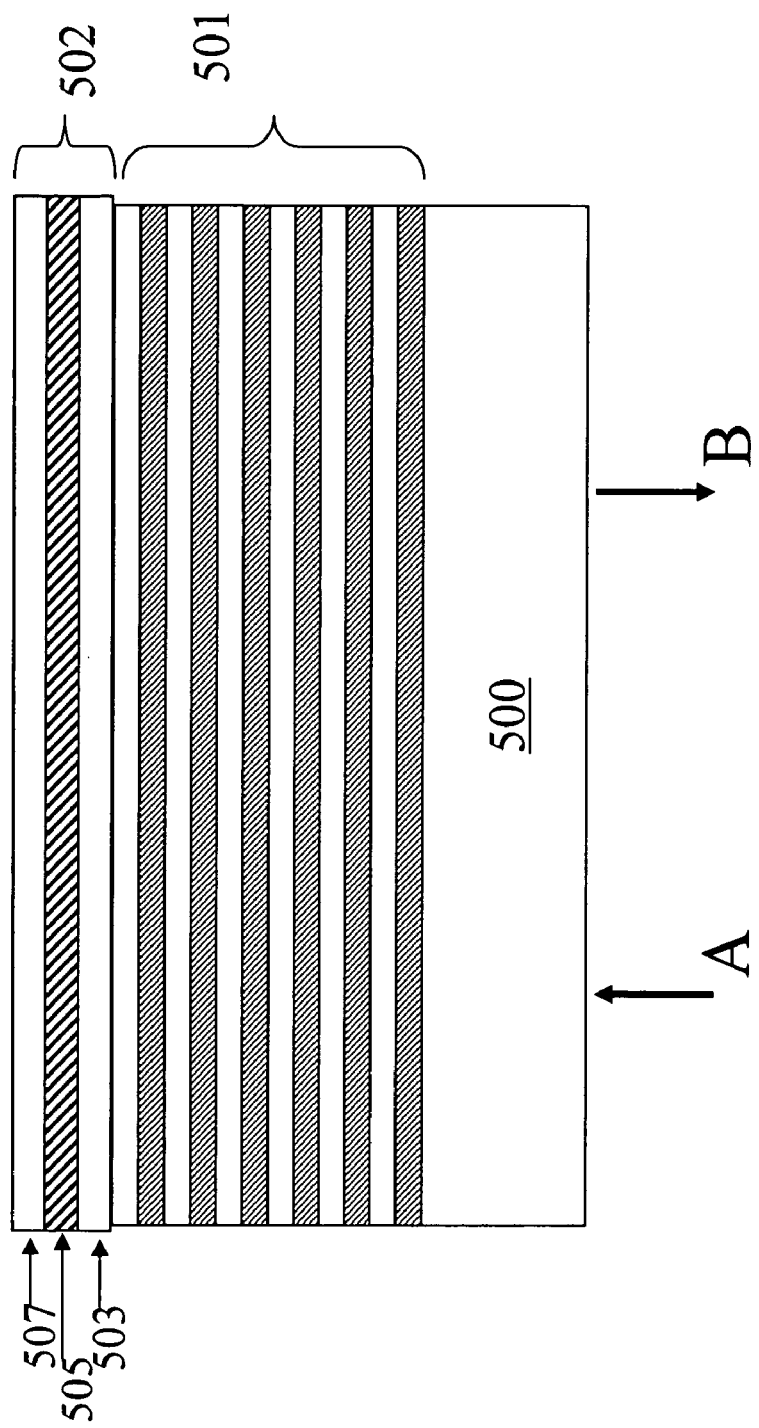
FIG. 5 shows an exemplary embodiment of a structure including an optoelectronic device and an aperiodic dielectric multilayer stack.

FIG. 5 shows an exemplary embodiment of a structure including an optoelectronic device and an aperiodic dielectric multilayer stack. Substrate 500 is modified with an aperiodic dielectric multilayer stack 501 having 12 layers. An optoelectronic device 502, for example, a light emitting, light detecting, or light absorbing device may then be applied to the stack.

According to an example embodiment, optoelectronic device 502 may be a photovoltaic device. An organic PV cell generally includes one or more active layers 505 surrounded by electrodes 507 and 503. Each active layer may include several sub-layers, for example, an acceptor layer adjacent to a layer of organic donor-type material. The boundary of the acceptor layer and the donor layer forms a heterojunction, which produces an internally generated electric field. The active layer may also include an acceptor material that has been mixed with a donor-type material creating interpercolating networks of like material. Any type of photovoltaic cell may be constructed here that is appropriate for the substrate according to conventional photovoltaic cell preparation including organic small-molecular, polymer or inorganic means.

Electrode 503 may be transparent to allow light to enter the PV cell, while electrode 507 may be metallic to reflect light into the active layer, however other configurations are possible. Examples of PV devices include a solar cell, an organic solar cell, a photodetector, or an organic photodetector, for example.

The structure illustrated in FIG. 5 may include an optical cavity defined by an aperiodic dielectric multilayer stack 501 on one end, and by electrode 507 on the other end. For embodiments where it is useful to employ such an optical cavity, electrode 507 is preferably reflective, or at least partially (50%) reflective. In a further embodiment of the invention, an optical cavity may be defined by aperiodic dielectric multilayer stack 501 on one end, and by a dielectric stack on the other end, whether aperiodic or periodic, disposed over electrode 507, which in this case is preferably transparent. Multiple stacked devices, including tandem solar cells, may be diposed within an optical cavity.

When electromagnetic radiation of an appropriate energy is incident upon a semiconductive organic material, a photon may be absorbed to produce an excited molecular state. This energy absorption is associated with the promotion of an electron from a bound state in the valence band to the conduction band, or equivalently, the promotion of a hole from the conduction band to the valence band. In organic thin-film photoconductors, the generated molecular state is generally believed to be an exciton, i.e., an electron-hole pair in a bound state, which is transported as a quasi-particle. The excitons can have an appreciable life-time before germinate recombination, which refers to the process of the original electron and hole recombining with each other as opposed to recombination with holes or electrons from other pairs. To produce a photocurrent the electron-hole pair must become separated. If the charges do not separate, they can recombine in a germinate recombination process, either radiatively—re-emitting light of a lower than incident light energy—, or non-radiatively—with the production of heat. The dielectric stack 501 serves to filter the incident radiation, as described above, to enhance the constructive interference of the light incident upon the substrate at the active layer or layers of the PV cell.

According to another example embodiment, optoelectronic device 502 may be an organic light emitting device (OLED). Generally, an OLED comprises at least one organic layer 505 disposed between and electrically connected to an anode 503 and a cathode 507. When a current is applied, the anode 503 injects holes and the cathode 507 injects electrons into the organic layer 505. The organic layer 505 may include several sub-layers.

A conventional double heterostructure OLED including a hole transporting layer, an emissive layer, and an electron transporting layer may be used for this purpose. The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. Photons must escape the OLED to be visible, a process which is limited by total internal reflection within the OLED device. Any type of OLED may be used, for example a monochromatic or a multicolor OLED. OLEDs having more layers (for example, blocking layers), or less layers (for example, an OLED without a separate electron transport layer) may be used. The OLED in this exemplary embodiment may have a transparent anode to allow the light emitted from the OLED to pass through to the substrate. However, other configurations are possible including, for example, a transparent cathode, or two transparent electrodes (i.e., TOLEDs).

According to the exemplary structure shown in FIG. 5, ambient light may travel, as indicated by arrow A, through the substrate 500, then through the dielectric stack 501, after which it may impinge upon the optoelectronic device 502. Light emitted from the optoelectronic device 502 will pass through the dielectric stack 501, then through the substrate 500, as indicated by the arrow B. The aperiodic dielectric multilayer stack serves to filter photons incident upon the optoelectronic device. In the case that optoelectronic device 502 is an OLED, this filtering will enhance the emission of photons in escape modes in the active organic layers of the OLED. By preventing undesirable photons from impinging upon the OLED, more of the photons generated in the OLED will be found to be in the modes that escape from the structure.

Figure 6:
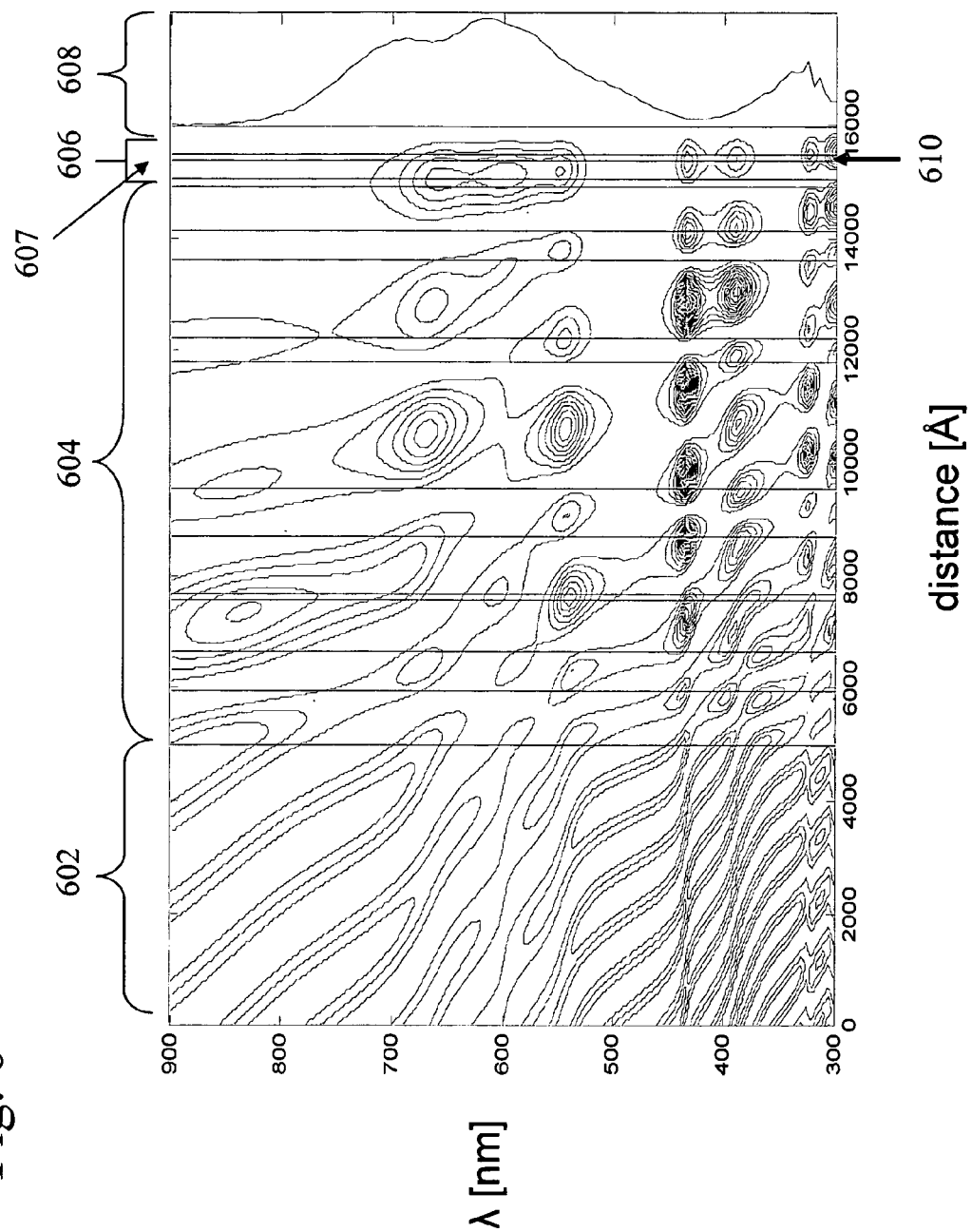
FIG. 6 shows a computer simulation of the coupling of light into the active region of a thin film organic PV cell that is part of a structure including an aperiodic dielectric multilayer stack and a glass substrate.

FIG. 6 shows the results of a computer simulation of the coupling of light into the active region of a thin film organic PV cell that is part of a structure including an aperiodic dielectric multilayer stack and a glass substrate. The thickness and composition of the various layers of the device and the aperiodic dielectric stack are described in Tables 1 and 2, and these layers may be arranged in a manner similar to that illustrated in FIG. 5. The vertical axis of FIG. 6 represents the wavelength in nanometers and the horizontal axis represents the position through the structure in angstroms. FIG. 6 is an isometric plot of optical mode intensity.

The structure modeled in FIG. 6 may include a substrate (preferably glass) onto which is applied an aperiodic dielectric multilayer stack including twelve layers, or six periods, where one period is a pair of layers including one layer of high refractive index material and one layer of low refractive index material. Along the x-axis, section 602 indicates the location of the glass substrate, section 604 indicates the location of the aperiodic stack, section 606 indicates the location of the organic layers of the optoelectronic device, and section 608 indicates the location of a metal electrode. Arrow 607 indicates a position within the organic layers for which the optical mode intensity is plotted as a function of wavelength in FIG. 7. Several relative maxima may be found in FIG. 6 at various locations and/or at different wavelengths throughout the device. Fine tuning the optimization allows the areas where these maxima are located to be shifted to desired locations in the structure. For example, if two devices are located at, for example, X angstroms from the substrate, and 2X angstroms from the substrate, the optimization may be performed to shift the maxima for a range of one or more wavelengths to be located at least at X angstroms and at 2X angstroms from an edge of the substrate. It may also be seen that several maxima are present at the same location across different wavelengths. For example, at arrow 610, which is located at about 15500 angstroms, significant maxima are located near the 300 nm, 375 nm, and 400 nm wavelengths.

For the device described in Table 2, the structure of an optimized dielectric stack was calculated, and the results are shown in Table 1. The dielectric stack of Table 1 represents a local maximum in the absorption efficiency, where the thicknesses of the layers of the dielectric stack are the variables:

TABLE 1

| layer | material | thickness |
| --- | --- | --- |
| 1 | $TiO_2$ | 946 |
| 2 | $SiO_2$ | 5 |
| 3 | $TiO_2$ | 697 |
| 4 | $SiO_2$ | 907 |
| 5 | $TiO_2$ | 117 |
| 6 | $SiO_2$ | 1021 |
| 7 | $TiO_2$ | 867 |
| 8 | $SiO_2$ | 2245 |
| 9 | $TiO_2$ | 418 |
| 10 | $SiO_2$ | 1366 |
| 11 | $TiO_2$ | 548 |

$TiO_2$ has a refractive index of about 2.3 and $SiO_2$ has a refractive index of about 1.4.

An exemplary PV cell is described in Table 2:

TABLE 2

| material | thickness |
| --- | --- |
| ITO | 150 |
| PEDOT | 320 |
| CuPc:PTCBI | 100 |
| BCP | 500 |
| Ag | 2000 |

According to FIG. 6, several of the brightest intensities occur in the 300 to 650 nm region, and near the active layer of the optoelectronic device, located near 15500 nm.

Figure 7:
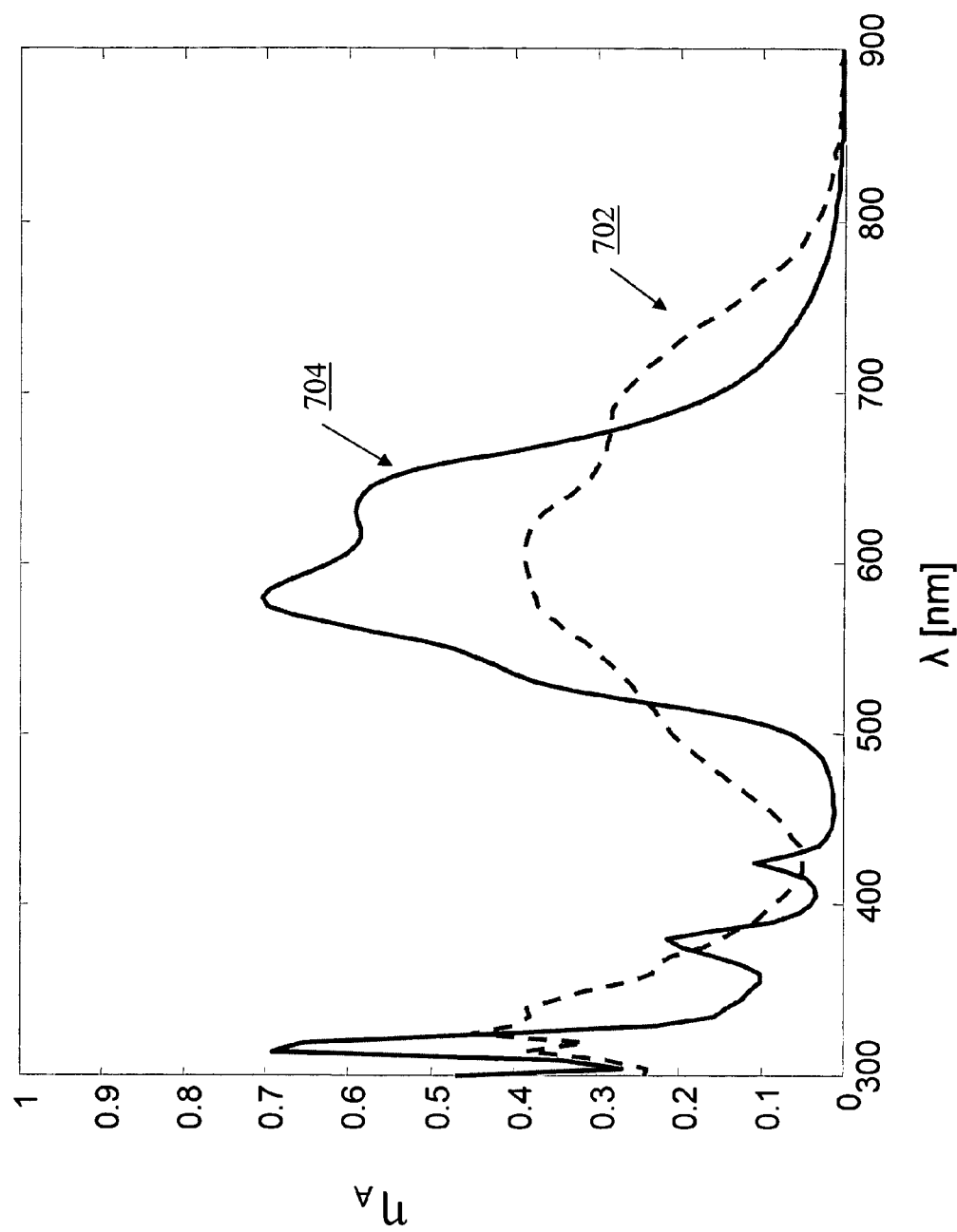
FIG. 7 shows a plot of a computer simulation of absorption efficiency in the organic region of the structure modeled in FIG. 6.

FIG. 7 shows absorption efficiency v. wavelength at a specific position (illustrated by arrow 607) in the organic region of the structure modeled in FIG. 6. Specifically, plot 704 shows efficiency v. wavelength at the position of arrow 607 in FIG. 6, for the structure modeled in FIG. 6, which includes an aperiodic dielectric stack. Plot 702 shows efficiency v. wavelength at the position of arrow 607 in FIG. 6, but for a structure that does not include an aperiodic dielectric stack. The device that does not include the aperiodic dielectric 12-layer stack (plot 702) achieves a maximum absorption efficiency of about 40% and an average of absorption efficiency of 26.7% between 450 nm and 750 nm. The average absorption efficiency value may be determined by, for example, integrating curve 702 over the entire range of wavelengths. The average absorption efficiency will be approximately equal to the external quantum efficiency. The absorption efficiency $\eta_A(\lambda)$ of a layer at a particular wavelength $\lambda$ may be calculated from the profile of the optical electric field between the boundaries ($x_1$ and $x_2$) of the layer, as follows:

$$\eta_A = \int_{x_1}^{x_2} \frac{4\pi c\varepsilon_0 k_j n_j |E_j|^2}{2\lambda |E_0|^2} dx,$$

where $k_j$ and $n_j$ are the imaginary and real part of the refractive index of the material of the layer, $E_j$ is the (complex) optical electric field, $E_0$ is the incident optical field strength, and c is the speed of light.

According to FIG. 7, a structure that includes the aperiodic dielectric 12-layer stack achieves a maximum absorption efficiency of about 70% and an average of absorption efficiency of 32.1% between 450 nm and 750 nm, as shown by curve 704. Therefore, the structure including the 12-layer stack achieves an improvement in maximum absorption efficiency of about 75% and an improvement in average absorption efficiency of about 20% over a comparable device without an aperiodic dielectric stack over the wavelength range of 450 nm–750 nm. Lesser improvements, such as 10% or 15%, may be readily acheived using embodiments of the invention. Greater improvements may also be acheived by using a greater number of layers and/or different materials.

Lesser improvements that may have significant commercial value may be readily achieved, for example with stacks having a smaller number of layers, and/or by allowing for minor thickness variances due to manufacturing processes. For example, improvements of 5% or more preferably 10% may be achieved. The FWHM of curve 702, between 450 nm and 750 nm is about 230 nm (725 nm minus 495 nm), with the maxium occurring at about 600 nm. The FWHM of curve 704, between 450 nm and 750 nm is about 160 nm (680 nm minus 520 nm), with the maxium occurring at about 585 nm. "FWHM" is the full-width half maximum, which is a parameter that measures the width of a peak at an amplitude that is one half of the maximum amplitude. Therefore, the absorption efficiency may be increased without a significant loss in bandwidth.

It is noted that, as these efficiencies are already calculated in percentages, a percent increase is calculated as the absolute value of the difference between the percentages, divided by the lower percentage, or |(P2−P1)|/P1. Therefore, a 10% increase in efficiency would indicate that the efficiency increased from 10% to 11%, not from 10% to 20%. The value as properly calculated, therefore, would indicate a 10% increase in the photon flux at the absorption layer.

According to an exemplary embodiment of a structure according to the present invention, the photocurrent generated by a device, for example, a solar cell, may be increased using an aperiodic dielectric multilayer stack. The solar cell may include an active layer that absorbs light which may be converted to photocurrent. For example, Table 3 shows the optimized values for thickness of the layers in nm and short circuit photocurrent, based on a solar spectra, AM1.5 from 300–900 nm for structures including dielectric stacks having different numbers of periods:

optimized aperiodic dielectric 6-layer stack, according to an exemplary embodiment of the present invention.

Figure 8:
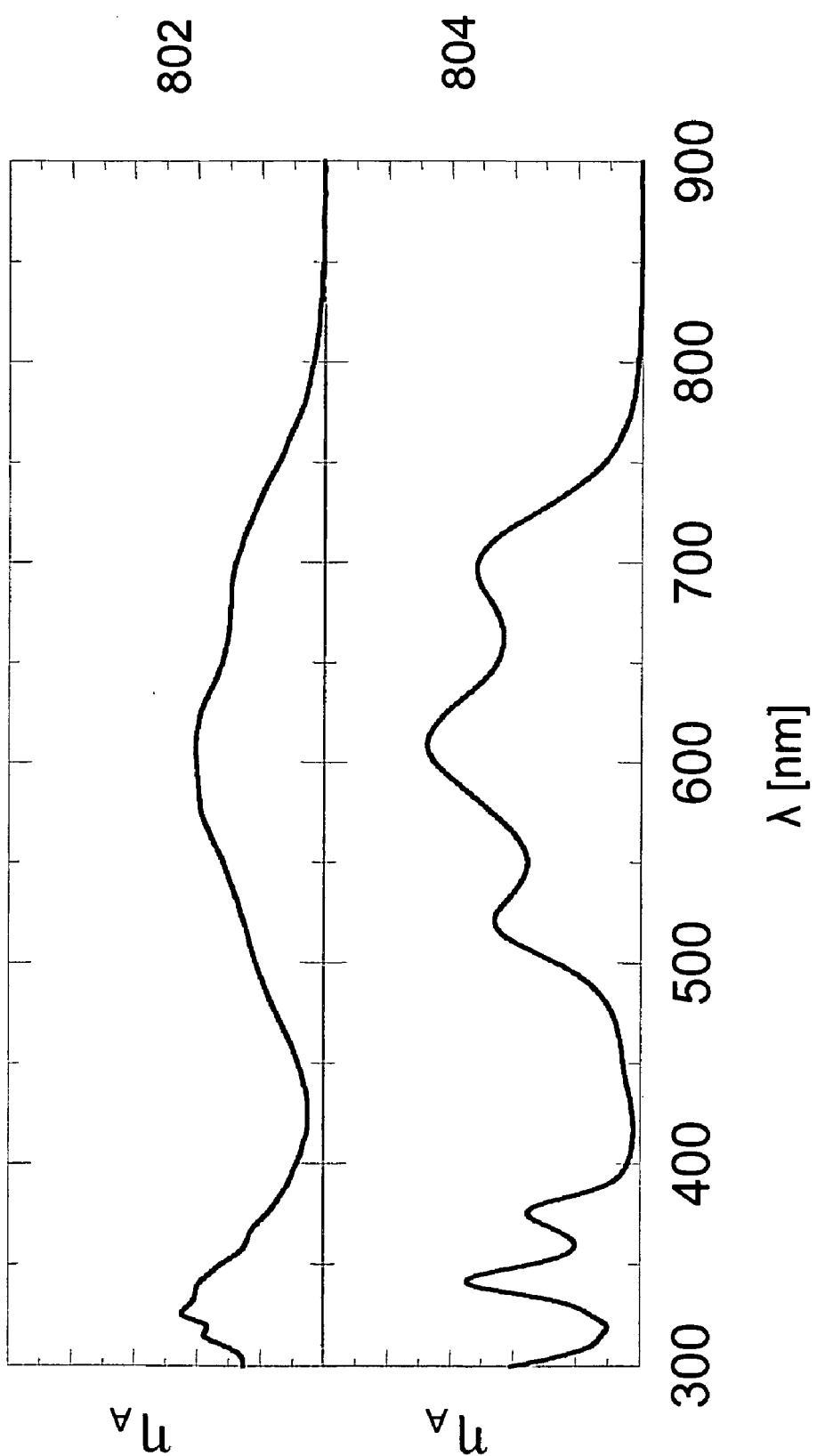
FIG. 8 shows a computer simulation of the absorption efficiency over the resonant bandwidth of a structure including an optoelectronic alone and that of a structure including an optoelectronic device modified to include an optimized aperiodic dielectric six-layer stack, according to an exemplary embodiment of the present invention.

The vertical axes represent absorption efficiency (arbitrary units) and the horizontal axes represent wavelength of FIG. 8. The upper plot 802 shows that a structure having no stack exhibits a maximum absorption efficiency of 40.5% and an average absorption efficiency of 19.8%. Furthermore, only one significant maximum occurs, which appears for a wavelength of about 600 nm. The lower plot 804 shows that the same structure modified to include an optimized aperiodic dielectric 6-layer stack exhibits a maximum absorption efficiency of 67.7% and an average absorption efficiency of 26.6%. Furthermore, three significant maxima occur for wavelengths between 500 nm and 800 nm. Similarly, the reflective behavior of the structure may be tailored to exhibit a broadband increase in resonance. By adding the optimized aperiodic dielectric 18-layer stack to the structure according to this exemplary embodiment of the present invention, the maximum absorption efficiency may be increased by about 67%, while the average absorption efficiency may be increased by about 34%.

FIGS. 9–12 show various plots regarding the emission intensity of an OLED, according to some exemplary embodiments of the present invention. The structure was modeled as a glass substrate layer, covered by a dielectric

TABLE 3

| # of periods | layer 1 | layer 2 | layer 3 | layer 4 | layer 5 | layer 6 | layer 7 | layer 8 | layer 9 | layer 10 | Current (mA/cm$^2$) |
|---|---|---|---|---|---|---|---|---|---|---|---|
| 0 | | | | | | | | | | | 5.00 |
| 1 | 3581 | 1367 | | | | | | | | | 5.53 |
| 1 | 1279 | 1317 | | | | | | | | | 5.58 |
| 2 | 1272 | 1316 | 0 | 0 | | | | | | | 5.59 |
| 2 | 1 | 367 | 1270 | 1321 | | | | | | | 5.58 |
| 2 | 1219 | 2020 | 1284 | 1319 | | | | | | | 5.68 |
| 3 | 0 | 954 | 19 | 675 | 1282 | 1325 | | | | | 5.58 |
| 3 | 1209 | 1776 | 931 | 1944 | 3608 | 1335 | | | | | 5.70 |
| 3 | 1317 | 1813 | 911 | 2137 | 1369 | 1342 | | | | | 5.77 |
| 3 | 1313 | 1814 | 914 | 2130 | 1370 | 1344 | | | | | 5.77 |
| 5 | 1466 | 310 | 1527 | 1945 | 1283 | 740 | 0 | 1197 | 1272 | 1304 | 5.80 |
| 5 | 1407 | 2121 | 1308 | 1805 | 947 | 1786 | 981 | 2019 | 1422 | 1337 | 5.82 |

Table 3 shows that the short circuit photocurrent through a structure without an aperiodic dielectric stack may be increased by at least 16% (5.82 is 16% greater than 5.00) by adding an appropriately optimized aperiodic dielectric stack. Lesser increases in short circuit photocurrent, such as 10% or 13% may be readily achieved. Greater increases may also be acheived by using stacks having more layers or possibly different materials.

FIG. 8 shows a computer simulation of the absorption efficiency over the resonant bandwidth of a structure including an optoelectronic device alone and that of a structure including an optoelectronic device modified to include an stack, onto which the OLED is situated. The OLED includes a 140 nm ITO, 60 nm HTL and 60 nm ETL, with a 100 nm aluminum electrode. The dielectric stack is composed of alternating layers of $TiO_2$, which has a refractive index of about 2.3, and $SiO_2$, which has a refractive index of about 1.4. Using a recursive algorithm, some initial guesses were made as to the optimal layer thickness for dielectric stack composed of 1, 2, and 3 periods (each period including 2 layers). Table 4 shows the initial guesses for thickness of the layers, the optimized values for thickness of the layers, and the percentage of light outcoupled into air and glass:

TABLE 4

| # of periods | layer 1 (nm) | layer 2 (nm) | Layer 3 (nm) | layer 4 (nm) | layer 5 (nm) | Layer 6 (nm) | Outcoupled into air (%) | Outcoupled into glass (%) | total |
|---|---|---|---|---|---|---|---|---|---|
| 0 (initial) | | | | | | | 25.1 | 25 | 50.1 |
| 0 (optimized) | | | | | | | | | |
| 1 (initial) | 500 | 500 | | | | | | | |
| 1 (optimized) | 633 | 528 | | | | | 35.6 | 16.5 | 52.1 |
| 2 (initial) | 500 | 500 | 633 | 528 | | | | | |
| 2 (optimized) | 591 | 893 | 707 | 427 | | | 39.3 | 14.7 | 54 |

TABLE 4-continued

| # of periods | layer 1 (nm) | layer 2 (nm) | Layer 3 (nm) | layer 4 (nm) | layer 5 (nm) | Layer 6 (nm) | Outcoupled into air (%) | Outcoupled into glass (%) | total |
| --- | --- | --- | --- | --- | --- | --- | --- | --- | --- |
| 3 (initial) | 500 | 500 | 591 | 893 | 707 | 427 | | | |
| 3 (optimized) | 647 | 878 | 717 | 826 | 727 | 366 | 40.2 | 17.3 | 57.5 |

Table 4 shows average outcoupling efficiencies over a wavelength range of 300–900 nm, with an AM1.5 solar spectrum. Based on the devices modeled to generate Table 4, the outcoupling efficiency into air increases from 25.1% for a structure with no dielectric stack, to 40.2% for a structure including an optimized 3 period dielectric stack, which represents about a 60% increase in outcoupling efficiency. Lesser increases in outcoupling efficiency into air, such as 40% or 50%, can readily be achieved with embodiments of the invention, and larger increases may also be achieved by using more layers in the stack. Accordingly, the outcoupling into glass decreases from 25% in a structure with no dielectric stack, to 17.3% for a structure including an optimized 3 period dielectric stack.

By appropriately treating the surface of glass (or other substrate) that is in contact with air, most or all of the light in the glass can be transmitted to the air with a probability T or be reflected back towards the active device at a randomized angle. The latter rays can reflect off the active device with reflectivity R back to the treated glass/air surface where they can attempt to escape again. The total outcoupling efficiency is then: eta=T+(1−T)*R*T+(1−T)$^2$*R$^2$*T+ . . . =T/(1−(1−T)*R). Typical values are T=0.5 and R=0.9, such that eta=0.91 (91%). For a structure that is designed for use in a display, such treatment can have the undesirable effect of bleeding light from one pixel into another. But for a structure designed for other uses, for example a light source, outcoupling efficiency may be important, while bleeding is not an important consideration. In this case, the "total" column in Table 3, multiplied by the eta, is a measure of how much light is eventually transmitted to air. Table 3 shows an improvement from 50.1%*0.91=45.6% with no aperiodic dielectric stack to 57.5%*0.91=52.3% with an optimized 3-period dielectric stack for total light transmission, in a situation where the parameter optimized was light outcoupled into air without a treated substrate. This represents an improvement of 14.7%. Lesser improvements, such as 10%, can readily be acheived. Greater improvements may also be acheived, by using a greater number of periods in the dielectric stack, by using different materials, and/or by optimizing for total light transmission (glass plus air).

Figure 9:
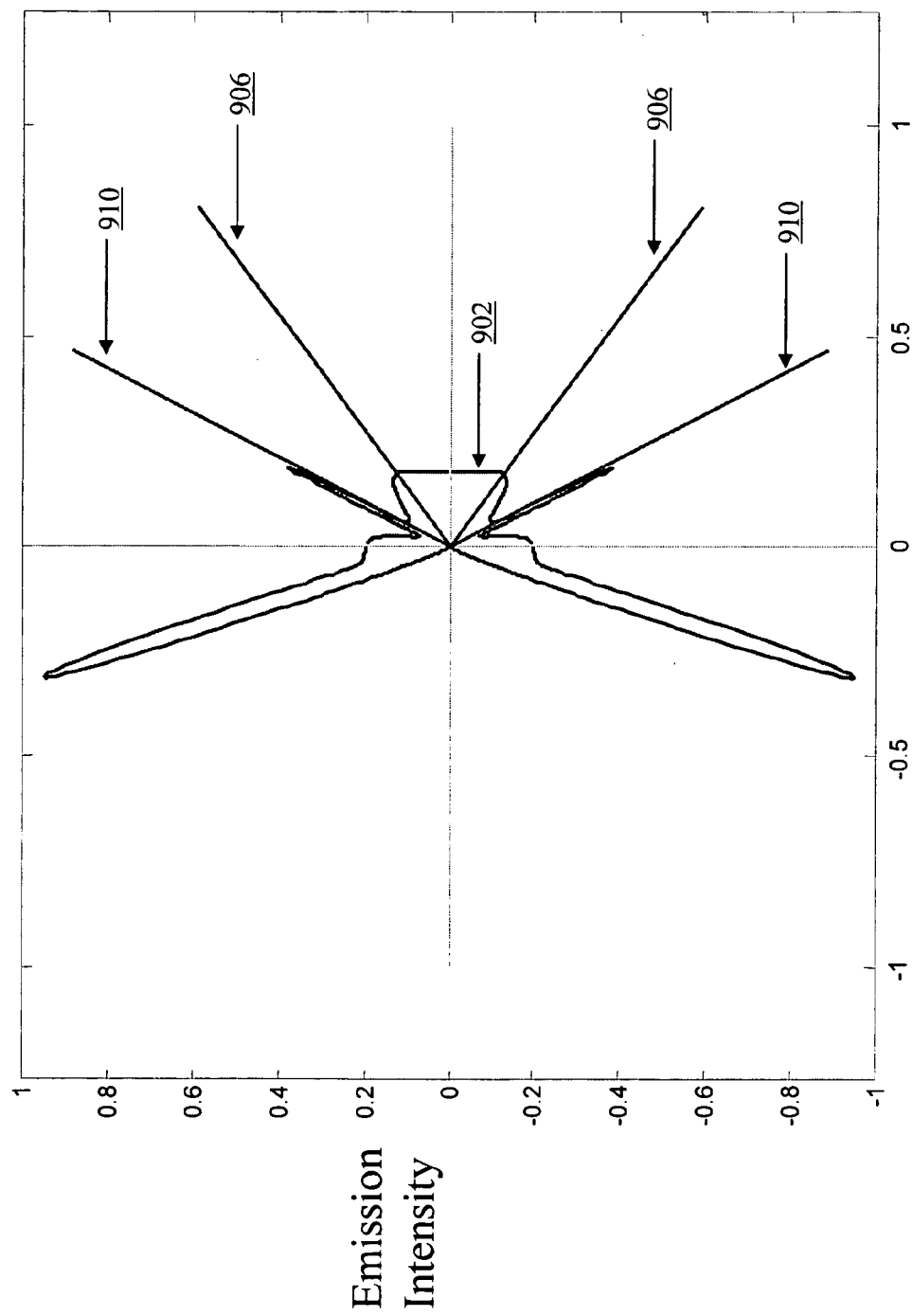
FIG. 9 shows the emission intensity plotted vs. polar angle for a structure including an OLED alone, according to an exemplary embodiment of the present invention.
Figure 10:
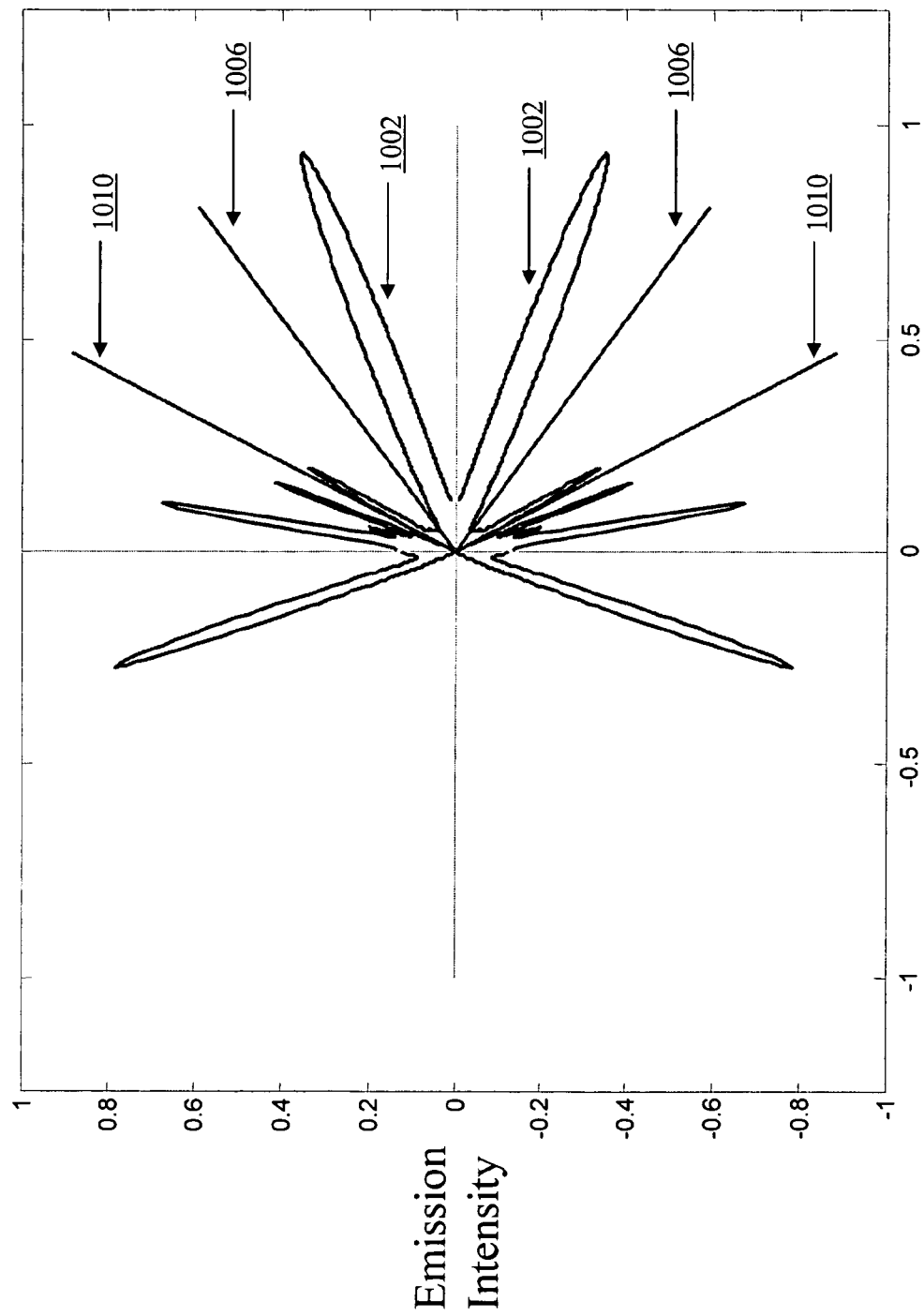
FIG. 10 shows the emission intensity plotted vs. polar angle for a structure including an OLED and an aperiodic dielectric multilayer stack, according to an exemplary embodiment of the present invention.

FIG. 9 shows the emission intensity plotted vs. polar angle for a structure including an OLED alone, according to an exemplary embodiment of the present invention. FIG. 10 shows the emission intensity plotted vs. polar angle for a structure including an OLED and an aperiodic dielectric multilayer stack, according to an exemplary embodiment of the present invention. Both figures correspond to a wavelength of 530 nm, by way of example. In FIGS. 9 and 10, lines 902 and 1002, respectively, represent the emission intensity curves of the light emission as seen from the organic layer(s). The total emission into a certain angle may be calculated by multiplying curve 902 (or 1002) by sin(θ), where θ is the polar angle.

Lines 906 and 1006 of FIGS. 9 and 10, respectively, in the first and fourth quadrants, represent the critical angle for the substrate, that is the largest angle at which light will couple into air. Therefore, at any angle between the right side of the horizontal axis and lines 906, the emitted light will out-couple into air. To determine the critical angle, which is measured from the 0 degree point, or the right side of the horizontal axis, the formula, $\theta_{CA}=\sin^{-1}(n_{air}/n_{org})$ where $n_{air}$ is the refractive index of air and $n_{org}$ is the refractive index of the organic material of the active layer. The escape cone may be defined to be the solid angle between line 906 (or 1006) in the first quadrant and line 906 (or 1006) in the fourth quadrant. The escape cone of a medium with index of refraction $n_1$ is defined as a solid angle such that rays that fall within this solid angle are not totally internally reflected (i.e. the transmission probability is non-zero) when the said medium interfaces with another medium with index of refraction $n_2$. When $n_2 > n_1$, the escape cone spans the entire solid angle corresponding to half a hemisphere since all rays have a non-zero transmission probability. When $n_2 < n_1$, the escape cone is limited to rays whose angle with the substrate normal is smaller than $\theta=\sin^{-1}(n_2/n_1)$. Note that the rays within the escape cone do not escape with unity probability. The Fresnel reflection and transmission coefficients dictate how much light is reflected and transmitted. For rays outside the escape cone, the reflection coefficient for rays "attempting" to escape evidently vanishes.

Lines 910 and 1010 of FIGS. 9 and 10, respectively, in the first and fourth quadrants, represent the critical angle for the substrate, that is the largest angle at which light will couple into the substrate, which in this exemplary embodiment is glass. Therefore, at any angle between lines 906 and 910 (or 1006 and 1010) in the first quadrant, and between the corresponding lines in the fourth quadrant, the emitted light will outcouple into glass. To determine the critical angle, which is measured from the 0 degree point, or the right side of the horizontal axis, the formula, $\theta_{CS}=\sin^{-1}(n_{sub}/n_{org})$, where $n_{sub}$ is the refractive index of the substrate and $n_{org}$ is the refractive index of the organic material of the active layer. At angles larger than lines 910 (or 1010), the emitted light will be waveguided.

Therefore, it may be seen that line 1002 in FIG. 10 reaches significantly higher values that line 902 in FIG. 9. Therefore, the structure including an aperiodic dielectric multilayer stack of FIG. 10 shows an increased emission intensity in the escape cone over the structure of FIG. 9. Using the optimized 3 period aperiodic dielectric stack, light may be shifted from being emitted in the glass modes to the air modes. In addition, the intensity of all modes may be increased using an optimized aperiodic dielectric multilayer stack. For example, according to an exemplary embodiment, the OLED may have one or more textured surfaces. Rather than shifting from glass modes to air modes, it may be desirable to simply increase all modes, therefore, the dielectric stack may be optimized accordingly to increase all modes.

Figure 11:
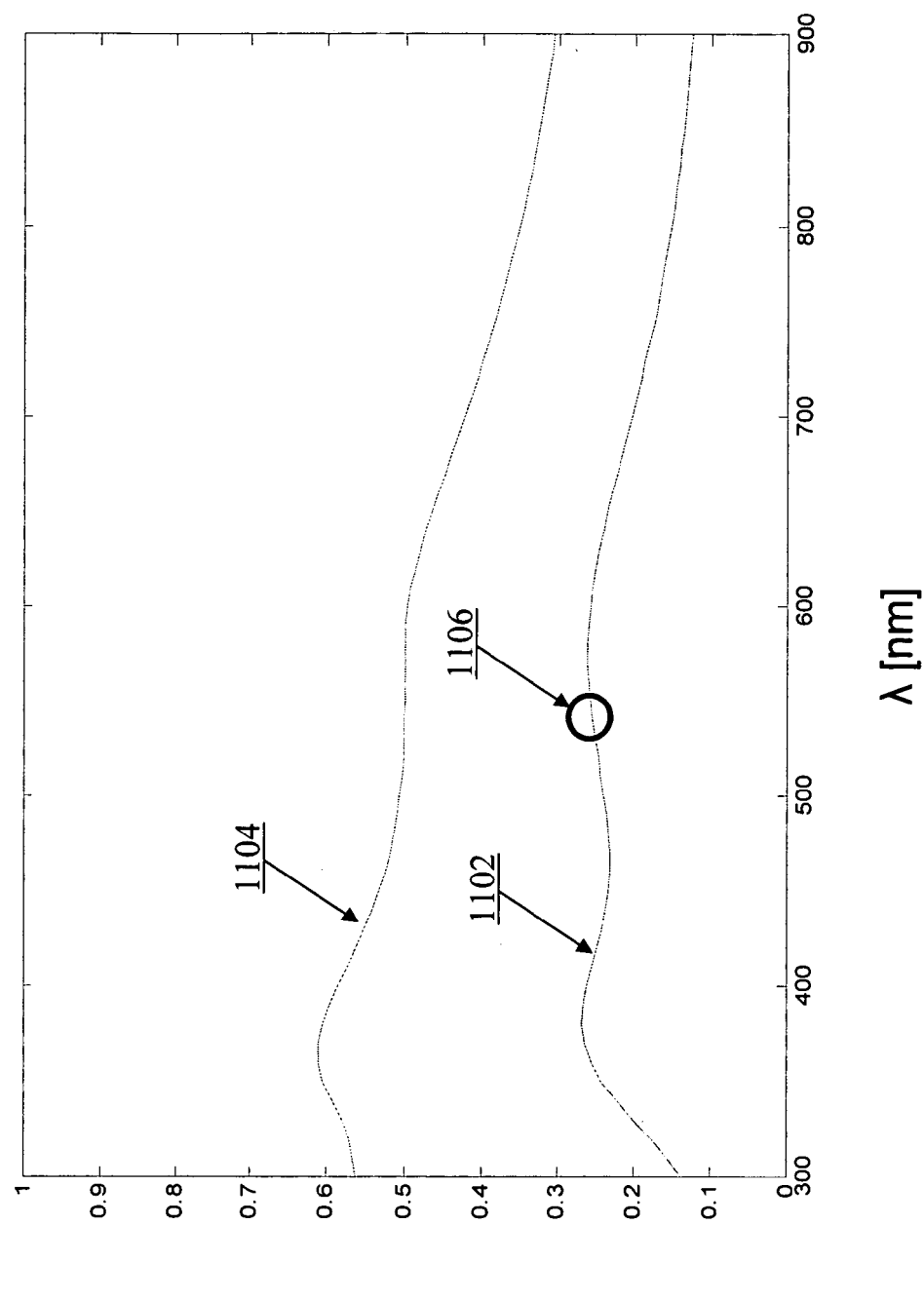
FIG. 11 shows a plot of the percentage of light outcoupled into the substrate, outcoupled into the air, and waveguided, over a range of wavelengths from 300 nm to 900 nm for a structure including an OLED alone, according to an exemplary embodiment of the present invention.

FIG. 11 shows a plot of the percentage of light outcoupled into the substrate, outcoupled into the air, and waveguided, over a range of wavelengths from 300 nm to 900 nm, for a structure including an OLED alone, according to an exemplary embodiment of the present invention.

Figure 12:
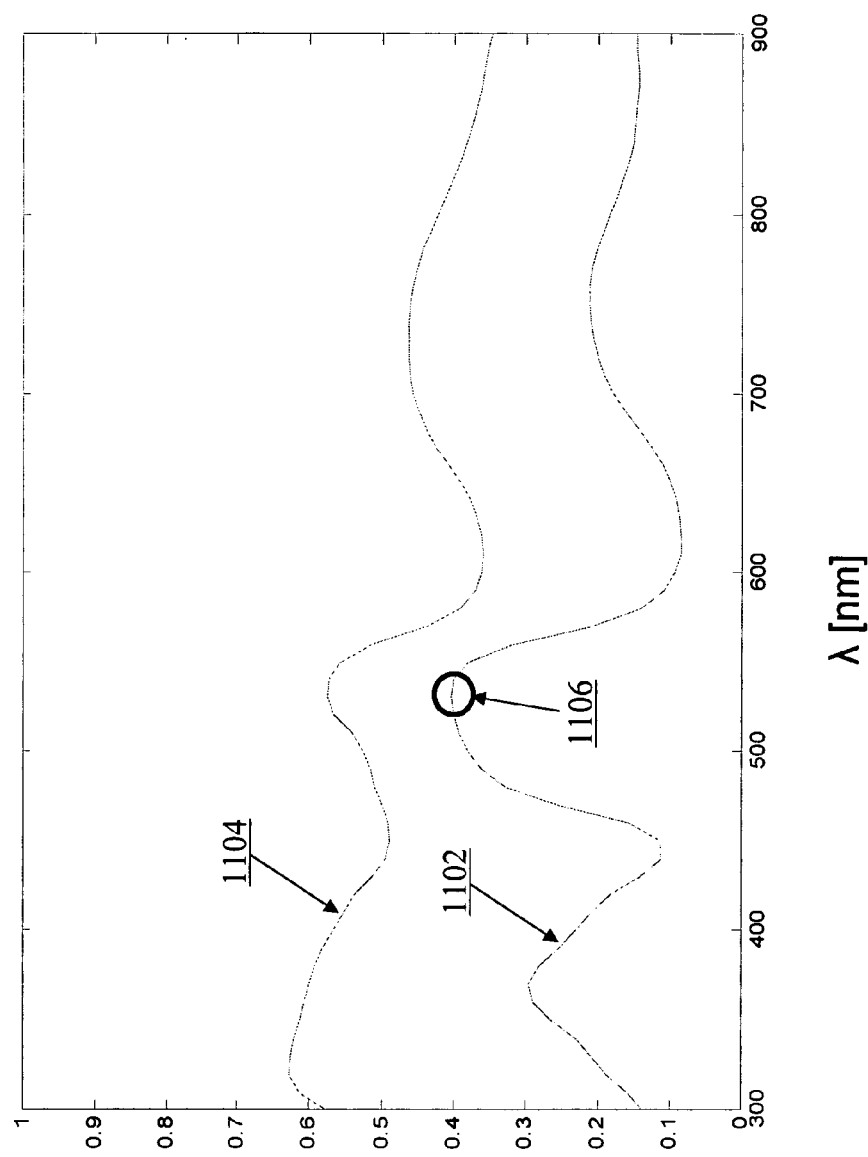
FIG. 12 shows a plot of the percentage of light outcoupled into the substrate, outcoupled into the air, and waveguided, over a range of wavelengths from 300 nm to 900 nm, for a structure including an OLED and an aperiodic dielectric multilayer stack, according to an exemplary embodiment of the present invention.

FIG. 12 shows a plot of the percentage of light outcoupled into the substrate, outcoupled into the air, and waveguided, over a range of wavelengths from 300 nm to 900 nm, for a structure including an OLED and an aperiodic dielectric multilayer stack, according to an exemplary embodiment of the present invention.

According to FIGS. 11 and 12, the area between the horizontal axis and curve 1102 represents the percentage of light outcoupled into air. The area between curves 1102 and 1104 represent the percentage of light outcoupled into the substrate. The area above curve 1104 represents the percentage of light that is waveguided. The circle 1106 represents the point at 530 nm in wavelength, which corresponds to the information presented in FIGS. 9 and 10. Therefore, it may be seen that, although some wavelength dependence is shown, the shifting of the percentage of light outcoupling into air may be accomplished over a broad range of wavelengths.

It is understood that the various embodiments described herein are by way of example only, and are not intended to limit the scope of the invention. For example, many of the materials and structures described herein may be substituted with other materials and structures without deviating from the spirit of the invention. It is understood that various theories as to why the invention works are not intended to be limiting. For example, theories relating to charge transfer are not intended to be limiting.

While the present invention is described with respect to particular examples and preferred embodiments, it is understood that the present invention is not limited to these examples and embodiments. The present invention as claimed therefore includes variations from the particular examples and preferred embodiments described herein, as will be apparent to one of skill in the art.

What is claimed is:

1. A structure, comprising:
   a substrate;
   a device disposed over the substrate; and
   a first dielectric stack disposed between the substrate and the device, wherein the first dielectric stack further comprises:
   a plurality of layers comprising a first dielectric material, wherein at least two of the layers comprising a first dielectric material have substantially different thicknesses;
   a plurality of layers comprising a second dielectric material;
   wherein the average outcoupling efficiency into air of the device over a bandwidth of at least 300 nm is at least 40% greater than that of an otherwise identical device disposed in a structure without the first dielectric stack.

2. The structure of claim 1, wherein the average outcoupling efficiency into air of the device over a bandwidth of at least 300 nm is at least 50% greater than that of an otherwise identical device disposed in a structure without the first dielectric stack.

3. The structure of claim 1, wherein the average outcoupling efficiency into air of the device over a bandwidth of at least 300 nm is at least 60% greater than that of an otherwise identical device disposed in a structure without the first dielectric stack.

4. The structure of claim 1, wherein the light is within the visible spectrum.

5. The structure of claim 1, wherein the device is a light emitting device.

6. The structure of claim 1, wherein the device is an organic light emitting device.

7. The structure of claim 1, wherein at least two of the layers comprising the second dielectric material have substantially different thicknesses.

8. The structure of claim 1, wherein a second dielectric stack is disposed over the device.

9. The structure of claim 1, wherein the first dielectric stack comprises alternating layers of the first dielectric material and the second dielectric material, and does not include any layers of a third dielectric material.

10. The structure of claim 1, wherein the second dielectric stack further comprises a layer comprising a third dielectric material.

11. A structure, comprising:
    a substrate having a treated surface that improves the outcoupling of light from the substrate into air;
    a device disposed over the substrate; and
    a first dielectric stack disposed between the substrate and the device, wherein the first dielectric stack further comprises:
    a plurality of layers comprising a first dielectric material, wherein at least two of the layers comprising a first dielectric material have substantially different thicknesses;
    a plurality of layers comprising a second dielectric material
    wherein the outcoupling efficiency into air of the device is at least 10% greater than that of an identical device in a structure without a dielectric stack.

12. The structure of claim 11, wherein the outcoupling efficiency into air of the device is at least 14.7% greater than that of an identical device in a structure without a dielectric stack.

13. A structure, comprising:
    an optical cavity defined by a first end layer and a second end layer;
    the first end layer further comprising a first dielectric stack, wherein the first dielectric stack further comprises:
    a plurality of layers comprising a first dielectric material, wherein at least two of the layers comprising a first dielectric material have substantially different thicknesses;
    a plurality of layers comprising a second dielectric material,
    an optoelectronic device having a first active layer disposed within the optical cavity.

14. The structure of claim 13, wherein the second end layer further comprises an at least partially reflective layer.

15. The structure of claim 13, wherein the second end layer further comprises a reflective electrode that is a part of the first optoelectronic device.

16. The structure of claim 13, wherein the second end layer is a dielectric stack.

17. The structure of claim 13, wherein the optoelectronic device is a solar cell, and wherein the short-circuit photocurrent of the solar cell when the structure is exposed to a solar spectra is at least 10% greater than the short-circuit photocurrent of a structure without the first dielectric stack.

18. The structure of claim 17, wherein the optoelectronic device is a solar cell, and wherein the short-circuit photocurrent of the solar cell when the structure is exposed to a solar spectra is at least 13% greater than the photocurrent out of a structure without the first dielectric stack.

19. The structure of claim 18, wherein the optoelectronic device is a solar cell, and wherein the short-circuit photocurrent of the solar cell when the structure is exposed to a solar spectra is at least 16% greater than the photocurrent out of a structure without the first dielectric stack.

20. The structure of claim 13, wherein the structure further comprises a second optoelectronic device having a second active layer disposed within the optical cavity.

21. The structure of claim 13, wherein the first optoelectronic device is an organic solar cell.

22. The structure of claim 13, wherein the first optoelectronic device is a photodetector.

23. The structure of claim 13, wherein the average absorption efficiency of the first active layer is at least 10% greater than that of a first active layer disposed a structure without the first dielectric stack, for wavelengths in the range of 450 nm to 750 nm.

24. The structure of claim 23, wherein the average absorption efficiency of the first active layer is at least 15% greater than that of a first active layer disposed a structure without the first dielectric stack, for wavelengths in the range of 450 nm to 750 nm.

25. The structure of claim 24, wherein the average absorption efficiency of the first active layer is at least 20% greater than that of a first active layer disposed a structure without the first dielectric stack, for wavelengths in the range of 450 nm to 750 nm.

* * * * *